(12) United States Patent
Wang

(10) Patent No.: US 6,642,767 B2
(45) Date of Patent: Nov. 4, 2003

(54) DC OFFSET CANCELLATION

(75) Inventor: Sung-ho Wang, Seoul (KR)

(73) Assignee: Berkana Wireless, Inc., Campbell, CA (US)

( * ) Notice: Subject to any disclaimer, the term of this patent is extended or adjusted under 35 U.S.C. 154(b) by 0 days.

(21) Appl. No.: 10/245,827

(22) Filed: Sep. 16, 2002

(65) Prior Publication Data

US 2003/0112049 A1 Jun. 19, 2003

Related U.S. Application Data

(63) Continuation of application No. 10/105,093, filed on Mar. 22, 2002, now abandoned.

(51) Int. Cl.[7] ................................................. H03L 5/00
(52) U.S. Cl. ........................................ 327/307; 327/358
(58) Field of Search ................................. 327/307, 355, 327/356, 358, 363, 362

(56) References Cited

U.S. PATENT DOCUMENTS 6,429,733 B1 * 8/2002 Pagliolo et al. ............. 327/552
6,483,380 B1 * 11/2002 Molnar et al. ............... 327/552
6,509,777 B2 * 1/2003 Razavi et al. ................ 327/307
6,535,725 B2 * 3/2003 Hatcher et al. .............. 455/317

* cited by examiner

Primary Examiner—Toan Tran
(74) Attorney, Agent, or Firm—Van Pelt & Yi LLP

(57) ABSTRACT

DC offset canceling is disclosed. A DC level fixing signal generator receives feedback input of two output signals from a mixer and generates a level fixing control signal to fix the DC level of the two output signals according to the input values. A DC offset canceling signal generator receives feedback input of two output signals from the mixer and generates offset canceling control signals to cancel the relative difference between the DC levels of the two output signals according to the input values. A DC level fixing and offset canceling circuit fixes the DC level of each of the two output signals from the mixer and cancels the relative difference between the DC levels of the two output signals according to the level fixing control signal and the offset canceling control signals.

6 Claims, 4 Drawing Sheets

DC OFFSET CANCELLATION

CROSS REFERENCE TO RELATED APPLICATIONS

This application is a continuation of U.S. patent application Ser. No. 10/105,093, now abandoned, entitled APPARATUS AND A METHOD FOR CANCELING DC OFFSET IN DIRECT CONVERSION TRANSCEIVER filed Mar. 22, 2002 which is incorporated herein by reference for all purposes, which claims priority to Korean Patent Application No. 10-2001-0014785, filed Mar. 22, 2001, which is incorporated herein by reference for all purposes.

FIELD OF THE INVENTION

The present invention relates generally to DC offset cancellation. More specifically, DC offset cancellation in a direct conversion transceiver is disclosed.

BACKGROUND OF THE INVENTION

In general, when using a direct conversion structure in an RF transceiver unit, the error rate increases during demodulation, due to the DC offset generated after the frequency conversion. There have been attempts to compensate the DC offset to ameliorate the noise problem.

FIG. 1 is a diagram illustrating an existing DC offset compensation technique. This technique passes the signal containing DC offset through a High Pass Filter HPF to eliminate the DC component. Its advantage is that the circuit can be very simple.

However, the signal is corrupted when it contains a DC component. Also, the data rate of the corner frequency must be 0.1% or less for the signal decay to be ignored. Additionally, if the corner frequency of the HPF is low, data may be lost temporarily during initialization.

FIG. 2 is a block diagram illustrating a feed-forward DC offset compensation technique. A baseband signal that passes through mixer 21 is converted into a digital signal by Analog to Digital Converter ADC 22. The offset is processed in a Digital Signal Processor DSP 23. The signal is then converted into an analog signal in Digital to Analog Converter DAC 24. The DC offset is then cancelled in the Level Shifter installed on the path of Mixer 21 on the basis of the converted analog signal.

FIG. 3 is a block diagram illustrating a feedback DC offset compensation technique. A baseband signal that passes through mixer 31 is converted into a digital signal in ADC 32, and the offset is processed in DSP 33. The signal is then converted into an analog signal in DAC 34. The DC offset is then cancelled in the Level Shifter installed on the path of Mixer 31 on the basis of the converted analog signal.

One disadvantage of the techniques illustrated in FIGS. 2 and 3 is that each compensation structure takes up a large area on the chip.

FIG. 4 is a diagram illustrating an existing DC offset compensation technique that cancels DC offset in a QPSK direct conversion transceiver. An average value of digital signals is obtained and saved in the memory. The value is then converted to analog, and from which the DC offset is subtracted. This method also has the disadvantage that the circuitry increases the chip size.

FIG. 5 is a diagram illustrating an existing DC offset compensation technique that uses an analog feedback. The DC offset compensator includes two PMOS transistors 51a and 51b, where the gates of the transistors are connected to each other and the sources are connected to two output terminals out and out_b of mixer 50. A DC Level Fixing Element also known as Common Mode Feedback Element 52 adjusts the voltage applied to the common gate of transistors 51a and 51b, as well as fixes the DC level of output signals mixer_out and mixer_out_b according to the feedback input value of the two output signals mixer_out and mixer_out_b coming out from output terminals out and out_b of mixer 50. DC Level Detectors 53a and 53b detect the fixed DC level of each of the output signals and obtain the difference from the predefined reference level. Level Shifters 54a and 54b are installed on the front of the DC level detector along the paths of each output signal and adjust the DC level of each of the output signals according to each of the level differences obtained in the above.

However, the example shown in FIG. 4 corrects DC offset of signal mixer_out on path 1 through level detector 53a and level shifter 54a on the basis of an absolute value of the reference level, and corrects DC offset of signal mixer_out_b on path 2 through the level detector 53b and level shifter 54b on the basis of the reference level. Since the DC offsets of the signals on the two paths are corrected on the basis of an absolute value, it is very probable that a mismatch may occur between the two resultant values after correction. Also, as the level shifters 54a, 54b are directly connected to the paths of the output signals, the linearity of the signals is decreased, causing distortions.

It would be useful if a DC offset compensation technique could be developed that avoids the difficulties associated with existing DC offset compensation techniques as described above.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1:
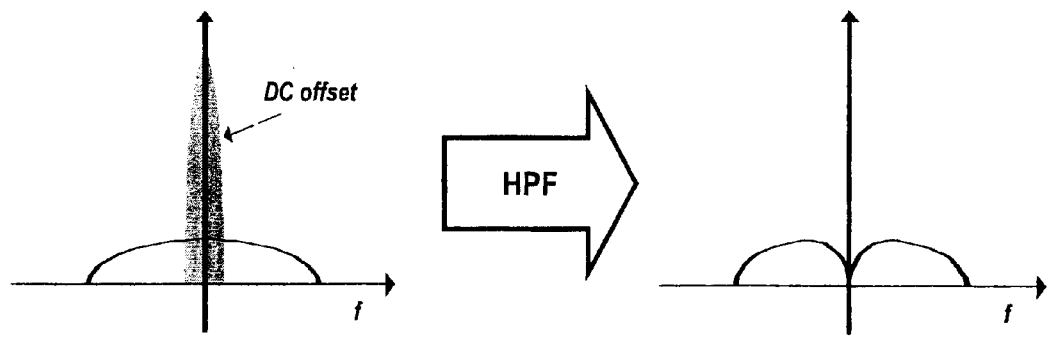
FIG. 1 is a diagram illustrating example 1 of an existing DC offset compensation technique.
Figure 2:
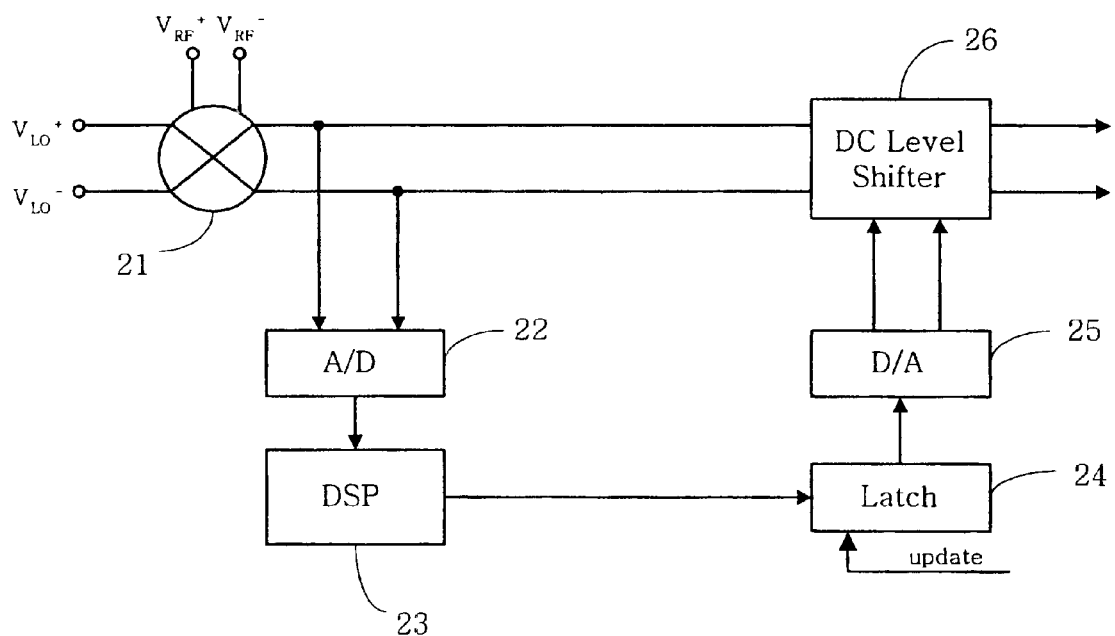
FIG. 2 is a diagram illustrating example 2 of an existing DC offset compensation technique.
Figure 3:
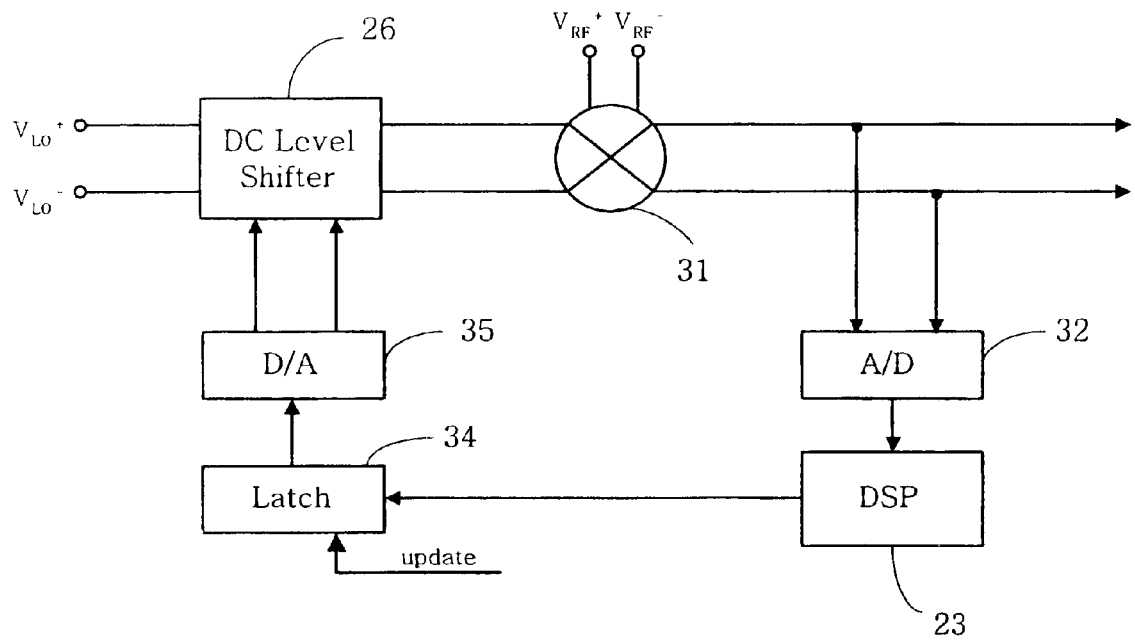
FIG. 3 is a diagram illustrating example 2 of an existing DC offset compensation technique.
Figure 4:
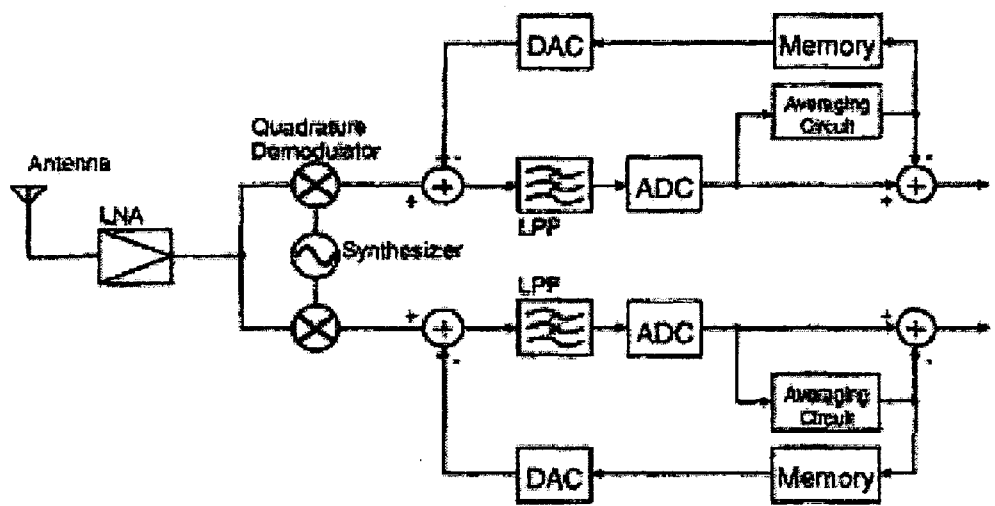
FIG. 4 is a diagram illustrating example 3 of an existing DC offset compensation technique.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Techniques are described that resolve the existing problems as described above, and accurately correct the DC offset in the frequencies that are directly converted downward through the mixer of a direct conversion transceiver of an RF transceiver unit. An apparatus and a method for canceling DC offset in direct conversion transceivers is provided with simplified structure and non-decreasing output linearity, performing relative comparison and correction between two DC levels and eliminating mismatch problems that may occur after correction in absolute comparison.

Canceling DC offset in the frequencies that are output from a downward conversion mixer is disclosed. In one embodiment, the frequencies are directly converted downward through a mixer of a direct conversion transceiver of an RF transceiver unit. A DC level fixing signal generator receives feedback input from two mixer output signals and generates a level fixing control signal to fix the DC level of the two signals. A DC offset canceling signal generator receives the feedback input of the two mixer output signals and generates two offset canceling control signals to cancel the relative difference between the DC levels of the two signals. A DC level fixing and offset canceling element fixes the DC level of the two mixer output signals and cancels the relative difference between the DC levels of the two mixer output signals in accordance with the level fixing control signal and the two offset canceling control signals.

To achieve the purpose as described above, in the mixer applied to the conversion transceiver, the apparatus for canceling DC offset in direct conversion transceivers includes: a DC level fixing signal Generator that receives feedback input of two output signals from the mixer and generates level fixing control signal to fix the DC level of each of the two output signals according to the input values; a DC Offset Canceling Signal Generator that receives feedback input of two output signals from the mixer and generates offset canceling control signals to cancel the relative difference between the DC levels of the two output signals according to the input values; and a DC Level Fixing & Offset Canceling circuit that fixes the DC level of each of the two output signals from the mixer and cancels the relative difference between the DC levels of the two output signals according to the control signals that are generated as above.

The DC offset canceling signal generator includes a differential amplifier element, which receives two output signals from the mixer and outputs two signals after differential amplification, and a smoothing element that smoothes each of the two output signals from the differential amplifier element and outputs the offset canceling control signals.

Figure 6:
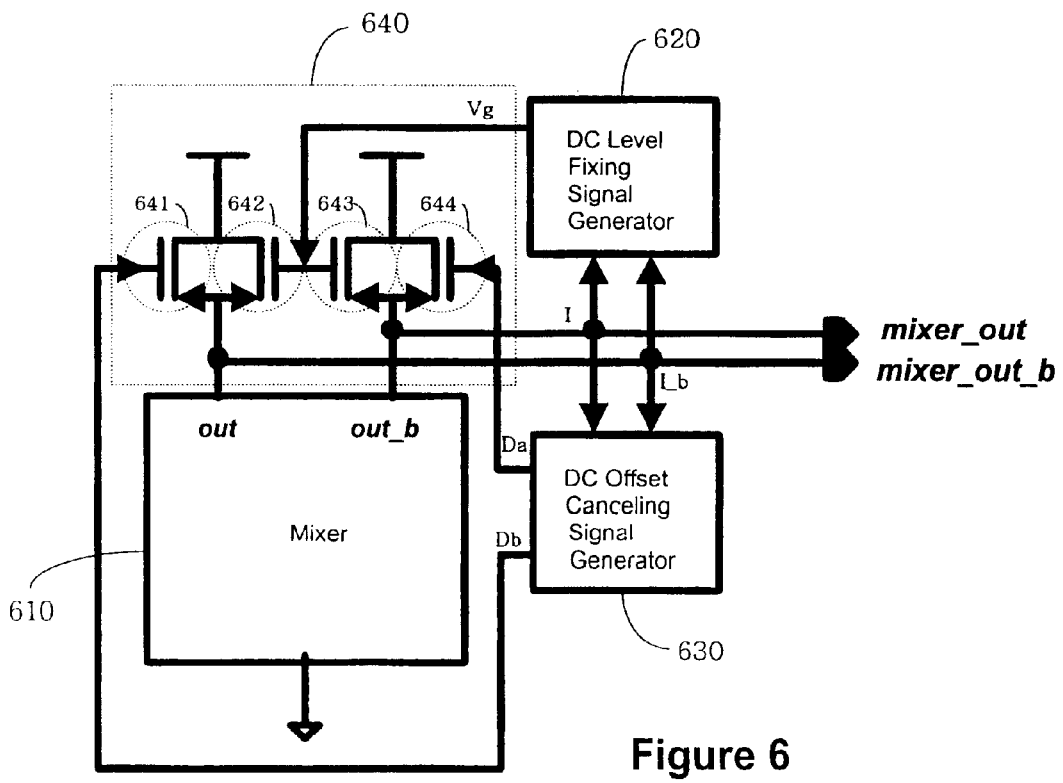
FIG. 6 is a block diagram of a DC offset canceller.

The DC level fixing & offset canceling circuit includes four PMOS transistors, where the drains and the sources of PMOS transistor 1 and PMOS transistor 2 are connected to each other, the drains and the sources of PMOS transistor 3 and PMOS transistor 4 are connected to each other, each set of the common sources is connected to the two output terminals of the mixer, the gates of the PMOS transistor 2 and the PMOS transistor 3 are connected to each other with the level fixing control signal applied to the common gate, and the offset canceling control signals are applied to the gate of the PMOS transistor 1 and to the gate of the PMOS transistor 4, respectively. FIG. 6 is a block diagram of a DC offset canceller in accordance with one embodiment. As illustrated in the figure, the canceller includes a Mixer 610 that converts RF signals downward, which are then applied to the conversion transceiver and are received as input on the basis of local oscillating LO signals, and output through two output terminals out and out_b signal I mixer_out and signal I_b mixer_out_b. For the purposes of illustration, this specification assumes that signal I_b mixer_out_b is an inverse of signal I. DC level fixing signal Generator 620 receives feedback input of the signal I mixer_out and the signal I_b mixer_out_b that are output from the two output terminals (out, out_b) of the mixer (610) and generates level fixing control signal Vg to fix the DC level of the two signals mixer_out and mixer_out_b on the basis of the input signals. DC Offset Canceling Signal Generator 630 receives feedback input of the signal I mixer_out and the signal I_b mixer_out_b that are output from the two output terminals (out, out_b) of the mixer (610) and generates offset canceling control signals Da and Db to cancel the relative difference between DC levels Va and Vb of the two signals mixer_out and mixer_out_b on the basis of the input signals. DC Level Fixing & Offset Canceling Element 640 uses control signals Vg, Da, Db generated as above to fix the DC level of the signal I mixer_out and the signal I_b mixer_out_b that are output from the two output terminals (out, out_b) of the Mixer (610) and cancels the relative difference between the DC levels of the two output signals (mixer_out, mixer_out_b).

DC Level Fixing & Offset Canceling Element 640 includes four PMOS transistors, where the drains and the sources of PMOS transistor 641 and PMOS transistor 642 are connected to each other, and the drains and the sources of PMOS transistor 643 and PMOS transistor 644 are connected to each other. The common drain of PMOS transistors 641, 642 that are connected to each other is connected to an output terminal out of the mixer 610, and the common drain of PMOS transistors 643, 644) that are connected to each other is connected to another output terminal out_b of the mixer 610. The connected gates of PMOS transistor 642 and PMOS transistor 643 are connected to each other with the have a level fixing control signal Vg applied to the common gate, and the offset canceling control signals Da and Db are applied to the gate of the PMOS transistor 641 and to the gate of the PMOS transistor 644, respectively.

Figure 7:
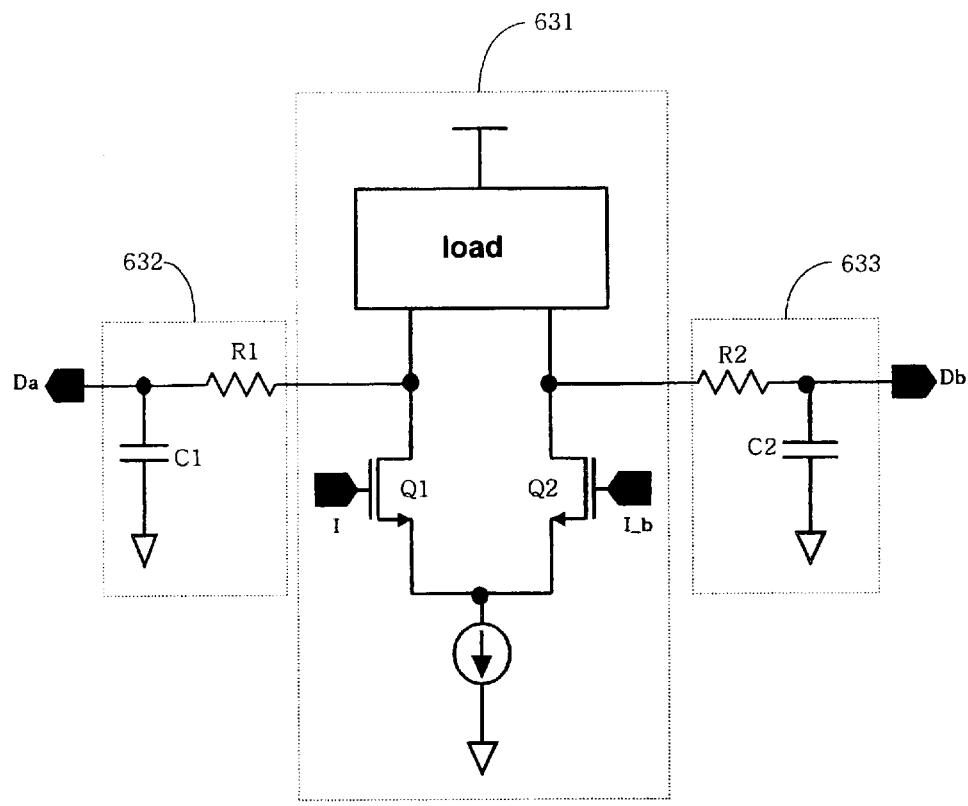
FIG. 7 is a circuit diagram of a DC offset canceling signal generator.

FIG. 7 is a circuit diagram of one embodiment of the DC offset canceling signal generator 630 in FIG. 6. The DC offset canceling signal generator includes: a Differential Amplifier 631 that includes two transistors Q1 and Q2 that receive signal I mixer_out and signal I_b mixer_out_b from two output terminals out and out_b of the mixer and output two signals after differential amplification; and Low Pass Filters (LPF1, LPF2) (632, 633) that include resistors R1 and R2 and capacitors C1 and C2, which smooth the two signals from the differential amplifier through low pass filters and output offset canceling control signals Da and Db.

In one embodiment, level fixing and offset canceling is accomplished as follows. Mixer 610 converts RF input signal downward as a local oscillating LO input signal and outputs signal I mixer_out and signal I_b mixer-out_b through two output terminals out, out_b. For the purpose of example, this description assumes that DC level Va of the signal I mixer_out is relatively higher than DC level Vb of the signal I_b mixer_out_b.

Figure 5:
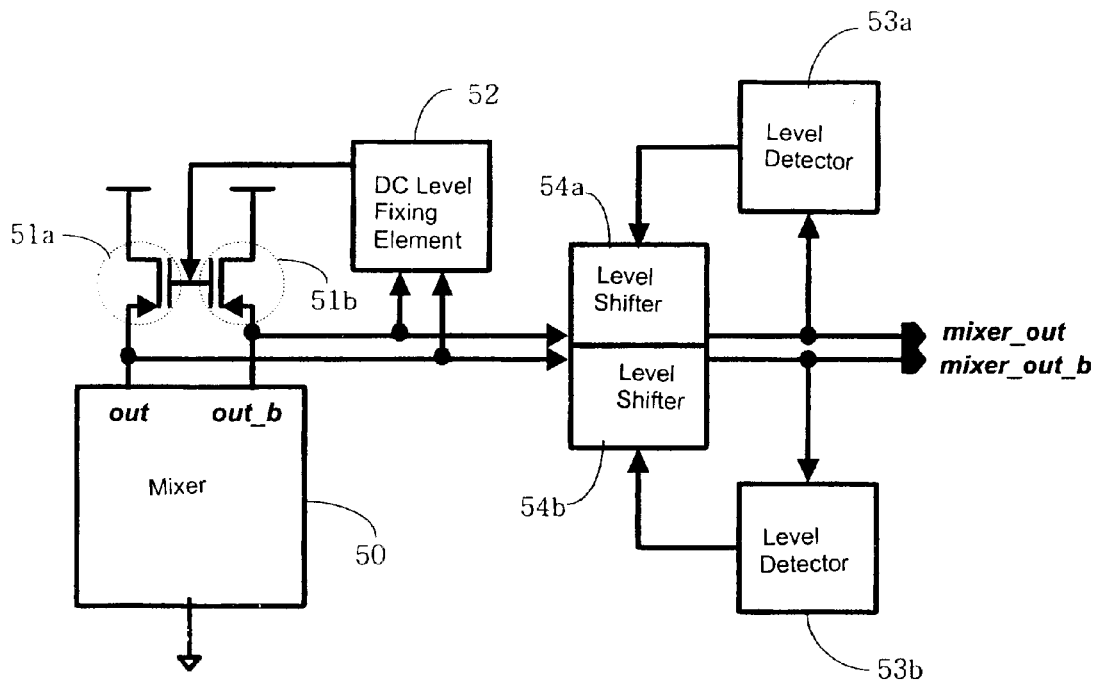
FIG. 5 is a diagram illustrating example 4 of an existing DC offset compensation technique.

In some embodiments, DC level fixing signal generator 620 are the same in its composition and operation as the existing DC level fixing element 52 in FIG. 5. DC level fixing signal generator 620 receives feedback input of the signal I mixer_out and the signal I_b mixer_out_b from the two output terminals out and out_b of mixer 610, generates level fixing control signal Vg to fix the DC level of each of the two signals mixer_out and mixer_out_b, and applies it to the common gate of the PMOS transistors 642 and 643 of the DC level fixing & offset canceling element 640. As a result of the operations of the DC level fixing & offset canceling element 640, the DC levels of signal I mixer_out and signal I_b mixer_out_b that are output from mixer 610 are fixed to Va and Vb, respectively, as illustrated in FIG. 8 in plot a.

Also, DC offset canceling signal generator 630 receives feedback input of signal I mixer_out and signal I_b mixer_out_b, whose DC levels are fixed to Va and Vb, respectively, as described above, as a result of the systematic operations of the DC level fixing signal generator 620 and the DC level fixing & offset canceling element 640. DC offset canceling signal generator 630 then applies the signal I mixer_out and the signal I_b mixer_out_b to the gates of the two transistors Q1, Q2 of the differential amplifier 631. The differential amplifier 631 outputs two signals that are differentially amplified according to the difference in DC levels Va, Vb of signal I and signal I_b, and the two output signals are smoothed through the low pass filters 632, 633 and output as the offset canceling control signals Da and Db, which are the DC control signals Da and Db shown in FIG. 8 in plot b.

DC control signals Da and Db are the offset canceling control signals that are output from the low pass filters 632 and 633. The control signals are applied to the gates of PMOS transistor 644 and PMOS transistor 641, respectively, of the DC level fixing & offset canceling element 640. As a result, in accordance with the operations of the DC level fixing & offset canceling element 640, the relative difference between the DC levels of the signal I mixer_out and the signal I_b mixer_out_b from the mixer 610 is cancelled.

Figure 8:
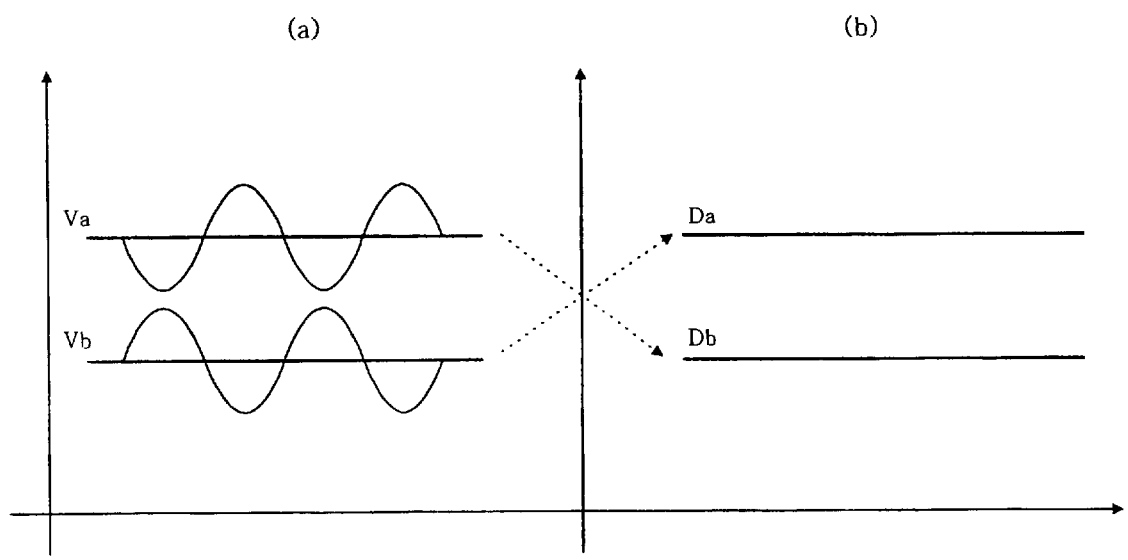
FIG. 8 is diagram illustrating the operation of the DC offset canceller.

Thus, considering the levels of the DC control signals Da and Db in FIG. 8, since Da is relatively lower than Db, the gate-source voltage VGS4 of PMOS transistor 644 increases as DC control signal Da increases, whereas the gate-source voltage VGS1 of PMOS transistor 641 decreases as DC control signal Db decreases, resulting in the DC level Va of the signal I mixer_out output from the mixer 610 being lowered and the DC level Vb of the signal I_b mixer_out_b being raised.

If, as a result of the above operations, DC level Va of the signal I mixer_out and DC level Vb of the signal I_b mixer_out_b, which are output from two output terminals out, out_b of the mixer 610, become equal, then the DC control signals Da and Db become equal, and the VGS4 and VGS1 become equal, too. Accordingly, DC level Va of the signal I mixer_out and DC level Vb of the signal I_b mixer_out_b maintain the same level.

Canceling DC offset in direct conversion transceivers has been described. The technique shown is simple compared to existing arrangements and it can maintain the linearity of the signals because it does not require on the output paths of the mixer the level shifters or other components pertaining to existing configurations as in FIG. 5, when frequencies are directly converted downward through the Mixer of the direct conversion transceiver of an RF transceiver unit. It performs relative comparison and correction between two DC levels, eliminating mismatch problems that may occur after correction in absolute comparison, and cancels DC offset between the outputs of the mixer completely.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A DC offset canceller including:
    a DC level fixing signal generator that receives feedback input of two output signals from a mixer and generates a level fixing control signal to fix the DC level of the two output signals according to the input values;
    a DC offset canceling signal generator that receives feedback input of two output signals from the mixer and generates offset canceling control signals to cancel the relative difference between the DC levels of the two output signals according to the input values; and
    a DC level fixing and offset canceling circuit that fixes the DC level of each of the two output signals from the mixer and cancels the relative difference between the DC levels of the two output signals according to the level fixing control signal and the offset canceling control signals.

2. A DC offset canceller as recited in claim 1 wherein the mixer is included in a direct conversion transceiver.

3. A DC offset canceller as recited in claim 1 wherein the DC offset canceling signal generator includes:
    a differential amplifier that receives two output signals from the mixer and outputs two output signals after differential amplification; and
    a smoother that smoothes the two output signals from the differential amplifier and outputs the offset canceling control signals.

4. A DC offset canceller as recited in claim 1 wherein the DC offset canceling signal generator includes:
    a differential amplifier that receives two output signals from the mixer and outputs two output signals after differential amplification; and
    a smoother that smoothes the two output signals from the differential amplifier and outputs the offset canceling control signals wherein the smoother includes low pass filters.

5. A DC offset canceller as recited in claim 1 wherein the DC level fixing & offset canceling circuit includes:
    a first PMOS transistor, a second PMOS transistor, a third PMOS transistor, and a fourth PMOS transistor wherein the drains and the sources of the first PMOS transistor and the second PMOS transistor are connected to each other, the drains and the sources of the third PMOS transistor and the fourth PMOS transistor are connected to each other, each set of the common drains is connected to the two output terminals of the mixer, the gates of the second PMOS transistor and the third PMOS transistor are connected to each other with the level fixing control signal applied to the common gate, and the offset canceling control signals are applied to the gate of the first PMOS transistor and to the gate of the fourth PMOS transistor, respectively, to characterize the apparatus for canceling DC offset in direct conversion transceivers.

6. A method of correcting DC offset between output signals output from a mixer including:
    fixing the DC levels of the two signals output from the mixer;
    detecting the two DC levels that are fixed as above; and
    canceling an offset between the DC levels of the two signals output from the mixer by lowering the level of the relatively high DC and raising the level of the relatively low DC on the basis of the relative difference between the two DC levels.

* * * * *